(12) United States Patent
Thompson et al.

(10) Patent No.: US 10,732,196 B2
(45) Date of Patent: Aug. 4, 2020

(54) ASYMMETRIC OUT-OF-PLANE ACCELEROMETER

(71) Applicant: InvenSense, Inc., San Jose, CA (US)

(72) Inventors: Matthew Thompson, Beaverton, OR (US); Houri Johari-Galle, San Jose, CA (US); Leonardo Baldasarre, Gavirate (IT); Sarah Nitzan, Palo Alto, CA (US); Kirt Williams, Portola Valley, CA (US)

(73) Assignee: InvenSense, Inc., San Jose, CA (US)

( * ) Notice: Subject to any disclaimer, the term of this patent is extended or adjusted under 35 U.S.C. 154(b) by 206 days.

(21) Appl. No.: 15/828,304

(22) Filed: Nov. 30, 2017

(65) Prior Publication Data

US 2019/0162747 A1 May 30, 2019

(51) Int. Cl.
| | |
|---|---|
| *G01P 15/08* | (2006.01) |
| *B81B 7/02* | (2006.01) |
| *G01P 15/125* | (2006.01) |
| *B81B 5/00* | (2006.01) |

(52) U.S. Cl.
CPC ............. *G01P 15/08* (2013.01); *B81B 5/00* (2013.01); *B81B 7/02* (2013.01); *G01P 15/125* (2013.01); *B81B 2201/0235* (2013.01); *G01P 2015/0831* (2013.01); *G01P 2015/0862* (2013.01); *G01P 2015/0871* (2013.01)

(58) Field of Classification Search
None
See application file for complete search history.

(56) References Cited

U.S. PATENT DOCUMENTS

| | | | |
|---|---|---|---|
| 6,845,670 B1 | 1/2005 | McNeil | |
| 7,426,863 B2 * | 9/2008 | Kuisma | ............... G01P 15/0802 73/514.32 |
| 9,297,825 B2 | 3/2016 | Zhang | |
| 2005/0268719 A1 | 12/2005 | Malametz | |
| 2007/0119252 A1 * | 5/2007 | Adams | ................ G01P 15/0802 73/510 |
| 2009/0308159 A1 | 12/2009 | Frey | |
| 2012/0000287 A1 * | 1/2012 | Frangi | ................... G01P 15/125 73/514.32 |
| 2012/0186347 A1 * | 7/2012 | McNeil | ................. G01P 15/125 73/514.32 |

(Continued)

FOREIGN PATENT DOCUMENTS

| | | |
|---|---|---|
| EP | 2775309 | 9/2014 |
| WO | WO2013104828 | 7/2013 |

OTHER PUBLICATIONS

PCT International Search Report for International Application No. PCT/US2018/048135, dated Sep. 17, 2019 (15 Pages).

*Primary Examiner* — Paul M. West
*Assistant Examiner* — Mark A Shabman
(74) *Attorney, Agent, or Firm* — Haley Guiliano LLP; Joshua Van Hoven; Maryam Imam

(57) ABSTRACT

A microelectromechanical (MEMS) accelerometer senses linear acceleration perpendicular to a MEMS device plane of the MEMS accelerometer based on a rotation of a proof mass out-of-plane about a rotational axis. A symmetry axis is perpendicular to the rotational axis. The proof mass includes a symmetric portion that is symmetric about the symmetry axis and that is contiguous with an asymmetric portion that is asymmetric about the symmetry axis.

17 Claims, 5 Drawing Sheets

(56) References Cited

U.S. PATENT DOCUMENTS

| | | |
|---|---|---|
| 2013/0192364 A1 | 8/2013 | Acar |
| 2013/0192371 A1* | 8/2013 | Rytkonen ............... G01P 15/18 |
| | | 73/514.32 |
| 2014/0251011 A1* | 9/2014 | Zhang .................... G01P 15/08 |
| | | 73/514.32 |
| 2014/0266170 A1 | 9/2014 | Seeger |
| 2016/0097792 A1* | 4/2016 | Naumann .............. G01P 15/18 |
| | | 73/504.02 |

* cited by examiner

ASYMMETRIC OUT-OF-PLANE ACCELEROMETER

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable proof masses that can respond to forces such as linear acceleration (e.g., for MEMS accelerometers), angular velocity (e.g., for MEMS gyroscopes), magnetic field and many others. The operation of these forces on the movable proof masses may be measured based on the movement of the proof masses in response to the forces. In some implementations, the proof mass movement is converted to an electrical signal by capacitive sense electrodes.

In a typical MEMS sensor, the proof masses may be located in close proximity to a number of fixed surfaces. Fixed electrodes, anchors, external frames may be located within the same device layer as the proof masses and adjacent to the proof masses. In the presence of undesired external forces, such as shocks, can cause the proof masses to contact the fixed surfaces causing wear or even catastrophic damage. Even smaller undesired external forces that do not cause the proof masses to contact the fixed surfaces may impact the motion of the proof mass and thus the resulting accuracy of the measured parameters.

SUMMARY OF THE INVENTION

In an exemplary embodiment of the present disclosure, a microelectromechanical (MEMS) accelerometer may comprise one or more anchors and a proof mass within a MEMS device layer comprising a plurality of contiguous portions that rotate collectively about a rotational axis in response to a linear acceleration along a sense axis, wherein the plurality of contiguous portions of the proof mass comprise a symmetric portion that is symmetric about a symmetry axis wherein the symmetry axis is perpendicular to the rotational axis and an asymmetric portion that is asymmetric about the symmetry axis. In some embodiments, one or more springs within the MEMS device layer couple the proof mass to the one or more anchors, wherein the one or more springs couple the proof mass to the one or more anchors such that the proof mass rotates about the rotational axis in response to the linear acceleration along the sense axis.

In an exemplary embodiment of the present disclosure, a microelectromechanical (MEMS) accelerometer may comprise one or more anchors, wherein a symmetry axis and a rotational axis intersect within the region defined by the one or more anchors, and a proof mass within a MEMS device layer, wherein the proof mass rotates collectively about the rotational axis in response to a linear acceleration along a sense axis, and wherein a first portion of the proof mass is symmetric about the symmetry axis and a second portion of the proof mass is not symmetric about the proof mass. In some embodiments, one or more springs within the MEMS device layer couple the proof mass to the one or more anchors, wherein the one or more springs couple the proof mass to the one or more anchors such that the proof mass rotates about the rotational axis in response to the linear acceleration along the sense axis.

In an embodiment of the present disclosure, a microelectromechanical (MEMS) accelerometer may comprise a first proof mass suspended within a MEMS device layer and comprising a plurality of first contiguous portions that rotate collectively about a rotational axis in response to a linear acceleration along a sense axis, wherein the plurality of first contiguous portions of the first proof mass comprise a first symmetric portion that is symmetric about a first symmetry axis wherein the first symmetry axis is perpendicular to the rotational axis and a first asymmetric portion that is asymmetric about the first symmetry axis. In some embodiments, the MEMS accelerometer may further comprise a second proof mass suspended within the MEMS device layer and comprising a plurality of second contiguous portions that rotate collectively about the rotational axis in anti-phase to the first proof mass in response to the linear acceleration along the sense axis, wherein the plurality of second contiguous portions of the second proof mass comprise a second symmetric portion that is symmetric about a second symmetry axis wherein the second symmetry axis is perpendicular to the rotational axis and parallel to the first symmetry axis, and a second asymmetric portion that is asymmetric about the second symmetry axis.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

Figure 1:
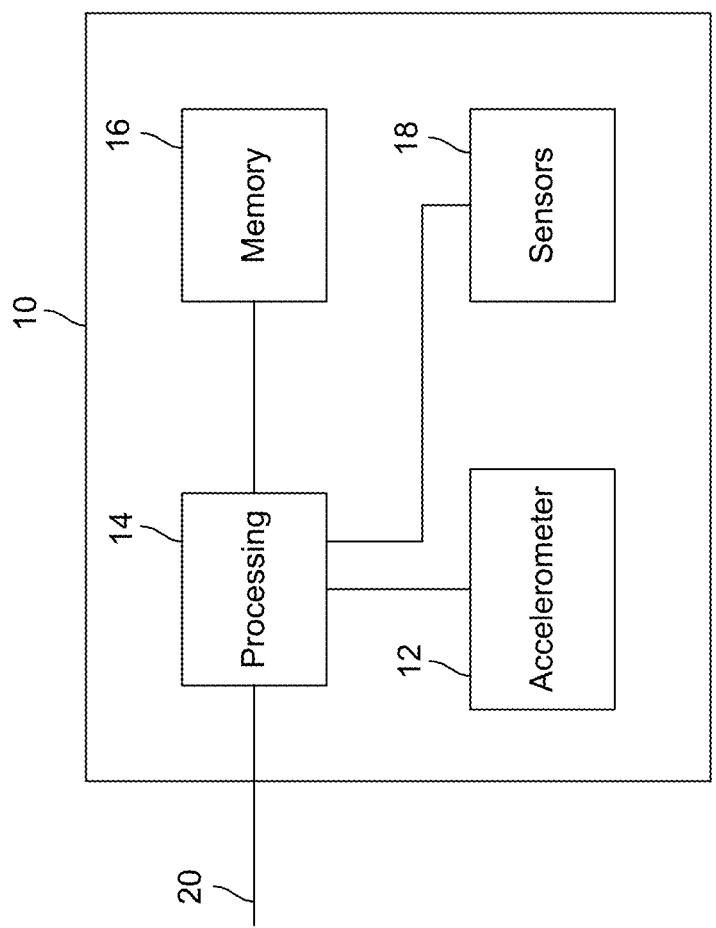
FIG. 1 shows an illustrative motion sensing system in accordance with an embodiment of the present disclosure.

An accelerometer is designed and manufactured as a microelectromechanical (MEMS) accelerometer. A MEMS layer is formed using semiconductor processing techniques to include the mechanical components of the sensor and electrical connections to other components of the MEMS accelerometer, such as CMOS circuitry located within the sensor die (e.g., a CMOS layer that also functions as a substrate or cap layer) or external to the sensor die. The MEMS layer is hermetically sealed within other semiconductor layers, such as an underlying substrate layer and a cap layer.

The MEMS layer includes a suspended spring-mass system in which one or more proof masses are suspended within the MEMS layer by springs. The movement of the proof masses is restricted by the springs, and in some embodiments, additional components such as masses and levers. These springs and additional components collectively facilitate the motion of the proof masses along one or more axes that are used for sensing linear acceleration. Sense electrodes are located adjacent to each proof mass in the direction of the sensed linear acceleration, forming a capacitor that changes based on the distance between the proof masses and sense electrodes.

The MEMS accelerometer may be a z-axis accelerometer that senses z-axis linear acceleration based on movement of the proof masses out of plane. A z-axis linear acceleration causes the proof masses to rotate about a rotational axis, with a portion of each proof mass moving out of plane towards some sense electrodes (e.g., increasing capacitance) and a portion of each proof mass moving away from some sense electrodes (e.g., increasing capacitance). Each proof mass may include a symmetric portion and an asymmetric portion. The symmetric portion may be symmetric about a symmetry axis which may intersect the rotational axis at an anchoring point. In response to large undesired forces (e.g., forces other than linear acceleration along the z-axis), the asymmetric portion of the proof mass may result in a rotational coupling of the forces that results in the rotation of the proof mass about the anchoring point.

Bump stops may extend from a fixed portion of the MEMS layer adjacent to the proof mass to prevent damage due to over travel of the proof mass in response to large undesired forces (e.g., shocks). The bump stops may be sized and placed at locations relative to the proof mass in a manner such that the bump stops will contact the proof mass when the rotation of the proof mass exceeds a rotation threshold in degrees such as 5-35 degrees (e.g., 15 degrees). The bump stops may be sized and located such that the rotational motion causes the proof mass to contact more bump stops than would be contacted in the instance of translational movement, resulting in a greater distribution of the shock force from the proof mass to the bump stops and reducing the likelihood of damage due to large undesired forces.

During normal operation a MEMS accelerometer will experience undesired forces other than the force to be measured but that are not large enough to contact the bump stops. Such forces may nonetheless result in measurement errors due to vibration rectification error (VRE), a condition that results in a non-zero bias signal being output by the sense electrodes. Because this vibration rectification error is difficult to measure during operation, it may be difficult to compensate for the non-zero bias signal during operation. At least a portion of the undesired forces may couple to the forces generated by the asymmetric proof mass in a manner that may result in a reduction in VRE.

Movable MEMS components such as proof masses may be located in close proximity to other movable components and fixed portions within the MEMS device plane. As a result of manufacturing tolerances, wear over time, and other conditions, the close proximity may result in the components being in physical contact while at rest. Stiction may refer to a condition where forces of surface adhesion exceed the mechanical restoring force of one or more movable MEMS components. The asymmetric proof mass portion creates a torque with respect to an applied linear force, such as shock, which results in the rotation of the moveable MEMS creating an angled contact between the surface of the proof mass and other MEMS components reducing the surface adhesion force that causes stiction.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS accelerometer 12 (e.g., an out-of-plane sensing accelerometer) and supporting circuitry, such as processing circuitry 14 and memory 16. In some embodiments, one or more additional sensors 18 (e.g., additional MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of a MEMS accelerometer 12 or other sensor 18, or on an adjacent portion of a chip to the MEMS accelerometer 12 or other sensor 18) to control the operation of the MEMS accelerometer 12 or other sensor 18 and perform aspects of processing for the MEMS accelerometer 12 or other sensor 18. In some embodiments, the MEMS accelerometer 12 and other sensors 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the MEMS accelerometer 12 by interacting with the hardware control logic, and process signals received from MEMS accelerometer 12. The microprocessor may interact with other sensors in a similar manner.

Although in some embodiments (not depicted in FIG. 1), the MEMS accelerometer 12 or other sensors 18 may communicate directly with external circuitry (e.g., via a serial bus or direct connection to sensor outputs and control inputs), in an embodiment the processing circuitry 14 may process data received from the MEMS accelerometer 12 and other sensors 18 and communicate with external components via a communication interface 20 (e.g., a SPI or I2C bus, or in automotive applications, a controller area network (CAN) or Local Interconnect Network (LIN) bus). The processing circuitry 14 may convert signals received from the MEMS accelerometer 12 and other sensors 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS accelerometers 12 and other sensors 18, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

An exemplary MEMS accelerometer (e.g., MEMS accelerometer 12) may include one or more movable proof masses that are configured in a manner that permits the MEMS accelerometer (e.g., a MEMS accelerometer or MEMS gyroscope) to measure a desired force such as linear acceleration along an axis. In some embodiments, the one or more movable proof masses may be suspended from anchoring points, which may refer to any portion of the MEMS sensor which is fixed, such as an anchor that extends from a layer (e.g., a CMOS layer) that is parallel to the MEMS layer of the device, a frame of the MEMS layer of the device, or any other suitable portion of the MEMS device that is fixed relative to the movable proof masses. The proof masses may be arranged in a manner such that they move in response to linear acceleration in the desired direction. In an exemplary embodiment, the movement of the proof masses out-of-plane relative to a fixed surface (e.g., a fixed sense electrode located below to the movable mass on the substrate) in response to the measured linear acceleration is measured and scaled to determine acceleration along the sensed axis.

Figure 2A:
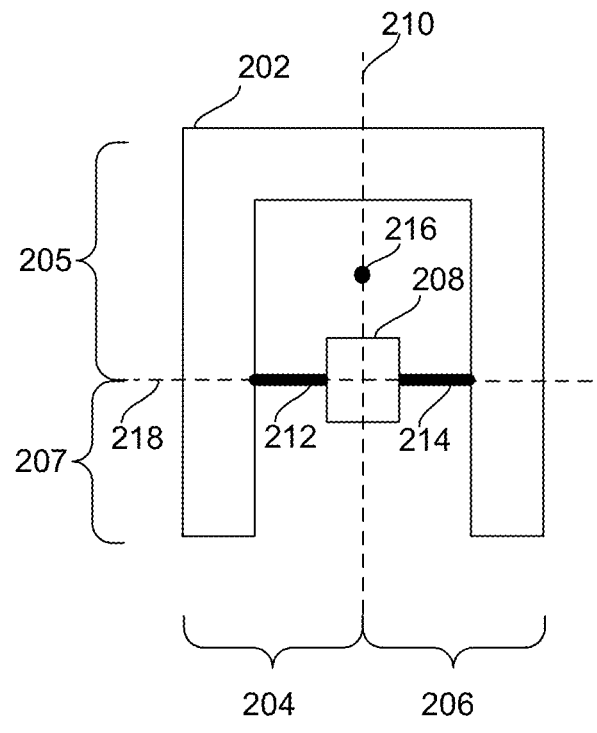
FIG. 2A shows an illustrative symmetric proof mass in accordance with some embodiments of the present disclosure.

FIG. 2A depicts an exemplary proof mass 202 of a MEMS accelerometer suitable for out-of-plane acceleration sensing in accordance with some embodiments of the present disclosure. Proof mass 202 is formed within a MEMS device layer and includes two parallel MEMS device planes in on opposite sides of the MEMS device layer forming parallel x-y planes. Although not depicted in FIG. 2A, a substrate layer may be located parallel to one of the MEMS device planes while a cap layer may be located parallel to the other of the MEMS device planes.

In the context of the present disclosure, a MEMS device plane located closest to the parallel substrate layer may be referred to as a bottom MEMS device plane and a MEMS device plane located closest to the parallel substrate layer may be referred to as the top MEMS device plane, although it will be understood that "top" and "bottom" are arbitrary terms describing relative location and may be swapped or otherwise modified as appropriate. The view of FIGS. 2A-2B may depict a top view of the top MEMS device layer. Although not depicted in FIGS. 2A-2B, a substrate layer is located parallel to the bottom MEMS device plane. Sense electrodes are located on the substrate layer below portions of the proof mass 202, forming one or more capacitors with the proof mass 202 that change capacitance based on the movement of the proof mass 202 along the z-axis relative to the sense electrodes.

An anchor 208 may be located in the MEMS device plane and coupled to the substrate and/or cap layer such that anchor 208 does not move, relative to the substrate, in response to forces experienced during normal operating conditions for the MEMS accelerometer. Springs 212 and 214 couple proof mass 202 to anchor 208 such that proof mass 202 is suspended from anchor 208 within the MEMS device plane. In an embodiment, springs 212 and 214 may be torsionally compliant about the x-axis to permit proof mass 202 to rotate about rotational axis 218 in response to linear acceleration along the z-axis.

In some embodiments, proof mass 202 may include two symmetrical portions 204 and 206 about a symmetry axis 210 and may asymmetrical about rotational axis 218. Proof mass 202 may have a center of mass 216 that is located along the symmetry axis 210 but is offset from the rotational axis 218 in the positive y-direction. The location of the center of mass 216 may facilitate movement of the proof mass 202 in response to linear acceleration along the z-axis. A linear acceleration in the positive z-direction may cause the center of mass 216 of the proof mass 202 to move in the negative z-direction about the rotational axis 218. An upper portion 205 of proof mass 202 (e.g., the portion located to the positive y-direction of the axis of rotation 218) may move towards the substrate and any sense electrodes located below the upper portion 205, increasing the capacitance associated with those sense electrodes. A lower portion 207 of proof mass 202 (e.g., the portion located to the negative y-direction of the axis of rotation 218) may move away from the substrate and any sense electrodes located below the lower portion 207, decreasing the capacitance associated with those sense electrodes. Linear acceleration in the positive z-direction may be determined based on one or both of these changes in capacitance.

A linear acceleration in the negative z-direction may cause the center of mass 216 of the proof mass 202 to move in the positive z-direction about the rotational axis 218. Upper portion 205 may move away from the substrate and any sense electrodes located below the upper portion 205, decreasing the capacitance associated with those sense electrodes. Lower portion 207 may move towards the substrate and any sense electrodes located below the lower portion 207, increasing the capacitance associated with those sense electrodes. Linear acceleration in the negative z-direction may be determined based on one or both of these changes in capacitance.

Figure 2B:
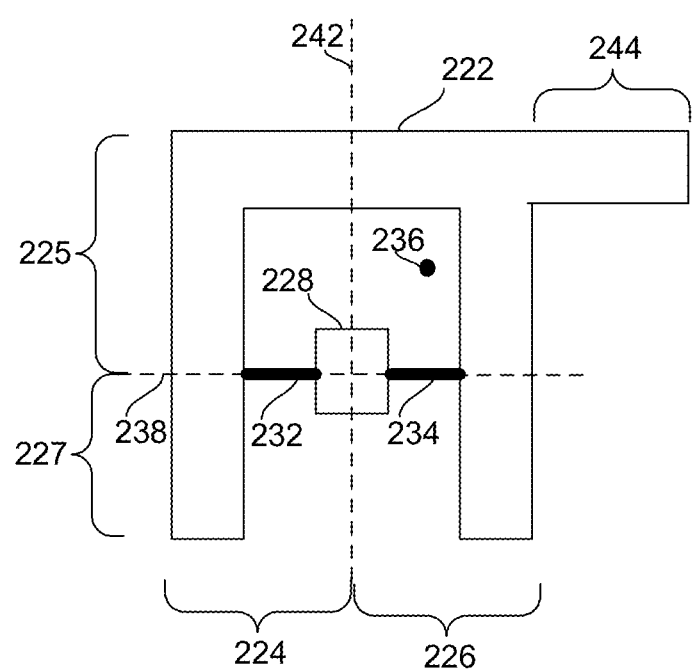
FIG. 2B shows an illustrative asymmetric proof mass in accordance with some embodiments of the present disclosure.

FIG. 2B depicts an exemplary asymmetric proof mass 222 of a MEMS accelerometer suitable for out-of-plane acceleration sensing in accordance with some embodiments of the present disclosure. Asymmetric proof mass 222 is formed within a MEMS device layer and includes two parallel MEMS device planes in on opposite sides of the MEMS device layer forming parallel x-y planes. Although not depicted in FIG. 2B, a substrate layer may be located parallel to one of the MEMS device planes while a cap layer may be located parallel to the other of the MEMS device planes.

The view of FIG. 2B may depict a top view of the top MEMS device layer. Although not depicted in FIG. 2B, a substrate layer is located parallel to the bottom MEMS device plane. Sense electrodes are located on the substrate layer below portions of the asymmetric proof mass 222, forming one or more capacitors with the asymmetric proof mass 222 that change capacitance based on the movement of the asymmetric proof mass 222 along the z-axis relative to the sense electrodes.

An anchor 228 may be located in the MEMS device plane and coupled to the substrate and/or cap layer such that anchor 228 does not move relative to the substrate in response to forces experienced during normal operating conditions for the MEMS accelerometer. Springs 232 and 234 couple asymmetric proof mass 222 to anchor 228 such that asymmetric proof mass 222 is suspended from anchor 228 within the MEMS device plane. In an embodiment, springs 232 and 234 may be torsionally compliant about the x-axis to permit asymmetric proof mass 222 to rotate about rotational axis 240 in response to linear acceleration along the z-axis.

In some embodiments, asymmetric proof mass 222 may include two symmetrical portions 224 and 226 about a symmetry axis 242. Asymmetrical proof mass 222 may also include a contiguous asymmetric extension 244 that extends from one of the symmetrical portions 224 and 226 (in some embodiments, symmetrical portions 224 and 226 may be collectively referred to as the symmetrical portion of the asymmetric proof mass 222). The asymmetric proof mass 222 (e.g., symmetric portions 224 and 226 and asymmetric extension 244) may have a center of mass 236 that is offset from the symmetry axis 242 in the positive x-direction based on the extra mass of asymmetric extension 244. The center of mass 236 of the asymmetric proof mass 222 be offset from the rotational axis 218 in the positive y-direction based on the additional mass of symmetric portions 224 and 226 as well as the additional mass of asymmetric extension 244.

The location of the center of mass 236 may facilitate movement of the asymmetric proof mass 222 in response to linear acceleration along the z-axis. Extraneous forces along other axes may couple to the desired out-of-plane movement of the asymmetric portion 244 such that undesirable phenomena such as VRE are substantially reduced. A linear acceleration in the positive z-direction may cause the center of mass 236 of the asymmetric proof mass 222 to move in the negative z-direction about the rotational axis 238. An upper portion 225 of asymmetric proof mass 222 (e.g., the portion located to the positive y-direction of the axis of rotation 238) may move towards the substrate and any sense electrodes located below the upper portion 225, increasing the capacitance associated with those sense electrodes. A lower portion 227 of asymmetric proof mass 222 (e.g., the portion located to the negative y-direction of the axis of rotation 218) may move away from the substrate and any sense electrodes located below the lower portion 227, decreasing the capacitance associated with those sense electrodes. Linear acceleration in the positive z-direction may be determined based on one or both of these changes in capacitance.

A linear acceleration in the negative z-direction may cause the center of mass 236 of the asymmetric proof mass 222 to move in the positive z-direction about the rotational axis 238. Upper portion 225 may move away from the substrate and any sense electrodes located below the upper portion 225, decreasing the capacitance associated with those sense electrodes. Lower portion 227 may move towards the substrate and any sense electrodes located below the lower portion 227, increasing the capacitance associated with those sense electrodes. Linear acceleration in the negative z-direction may be determined based on one or both of these changes in capacitance.

Linear in-plane acceleration in x or y applies not only a linear force but also a torque onto proof mass 222, since the center of mass is offset from the center of rotation at the anchor center where the rotation axis 238 intersects the symmetry axis 242. This causes the proof mass to not only translate but also rotate in-plane. It is advantageous to have the proof mass translate and rotate due to these linear inputs. For large in-plane shocks the rotational and linear motion of the proof mass share the energy of the excitation which removes the concentration of energy which can lead to damage and failure. For small shocks the translation and rotation can help reduced the contact area associated with adhesion force and prevent stiction. There is one direction of input where the rotation center and the center of mass 236 align however, this can be optimized to so that it does not align with the minimum stiffness directions, which are typically designed to be along the x, y or z axes.

Figure 3:
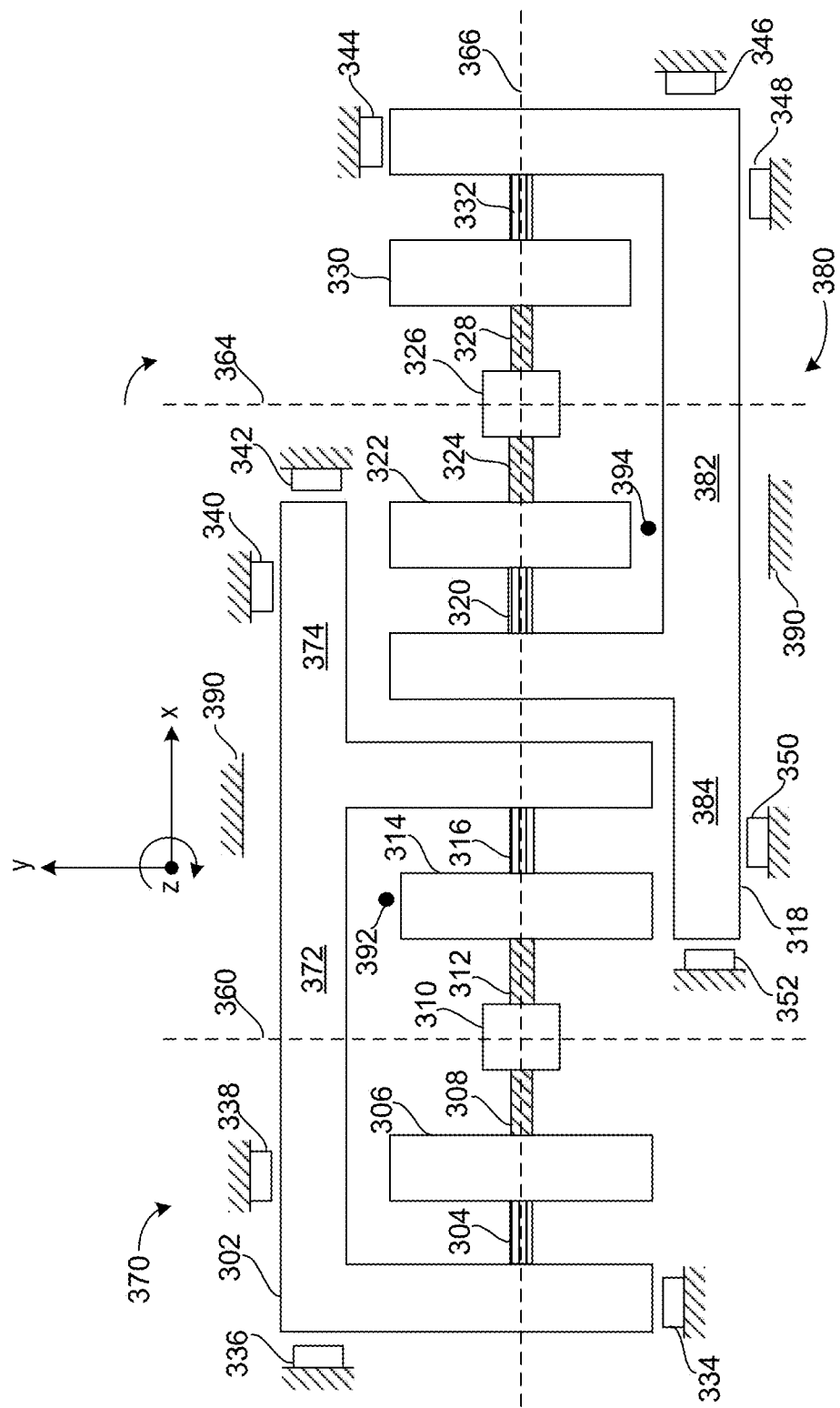
FIG. 3 shows an illustrative out-of-plane sensing accelerometer in accordance with some embodiments of the present disclosure.

FIG. 3 shows an illustrative out-of-plane sensing accelerometer in accordance with some embodiments of the present disclosure. It will be understood by a person having ordinary skill in the art that FIG. 3 may be modified in a variety of manners in accordance with the present disclosure. The components of FIG. 3 are formed within a MEMS device layer and include two parallel MEMS device planes in on opposite sides of the MEMS device layer forming parallel x-y planes. Although not depicted in FIG. 3, a substrate layer may be located parallel to one of the MEMS device planes while a cap layer may be located parallel to the other of the MEMS device planes.

In some embodiments, the accelerometer of FIG. 3 may include a first sensor portion 370 and a second sensor portion 380, each of which includes similar or identical components. The first sensor portion and second sensor portion are oriented such that a center of mass associated with the proof mass 302 (i.e., of first sensor portion 370) and proof mass 318 (i.e., of first sensor portion 370) cause anti-phase movement about the x-axis in response to a linear acceleration along the z-axis. The first sensor portion 370 and second sensor portion 380 are surrounded by a fixed MEMS portion 390, portions of which are depicted in FIG. 3 with diagonal lines.

In an embodiment, first sensor portion 370 includes an anchor 310 that may be coupled to paddle masses 306 and 314 by connection bars 308 and 312. Paddle masses 306 and 314 may be coupled to proof mass 302 by springs 304 and 316. Connection bars 308 and 312 may be substantially rigid but may facilitate rotational movement of the paddle masses 306 and 314 and the proof mass 302 about rotational axis 366. Springs 304 and 316 may be substantially rigid along the x-axis, may permit limited movement along the y-axis, and may have substantial torsional compliance to allow for the rotation of proof mass 302 about rotation axis 366. A symmetry axis 360 may be perpendicular to rotational axis 366 and may intersect the rotational axis at a center point of the anchor 310. Proof mass 302 may include a symmetric proof mass portion 372 and an asymmetric proof mass portion 374. Symmetric proof mass portion 372 may be symmetric about the symmetry axis 360. Asymmetric proof mass portion 374 may extend from symmetric proof mass portion 372, such that the proof mass 302 as a whole is asymmetric and has no axis of symmetry. A center of mass 392 for the proof mass 302 may be offset from symmetry axis 360 in the positive x-direction and may be offset from rotational axis 366 in the positive y-direction.

In some embodiments, a plurality of bump stops may extend from the fixed MEMS portion 390 towards a movable component such as proof mass 302. The bump stops may provide surfaces that are contacted under circumstances such as proof mass over travel or shocks. Although it will be understood that additional or fewer bump stops of suitable shapes and sizes may be by implemented in different embodiments in accordance with the present disclosure, in an exemplary embodiment six substantially rectangular bump stops 334, 336, 338, 340, and 342 may be located at locations adjacent to proof mass 302.

In an exemplary embodiment, bump stop 334 may be located adjacent to a bottom-left portion of symmetric proof mass portion 372 to inhibit translational movement of proof mass 302 in the negative y-direction. Bump stop 334 may also be located such that rotation of the proof mass 302 about the z-axis (or combined translational and rotational movement) may cause the bottom-left portion of symmetric proof mass portion 372 to contact the bump stop 334 at an angle. In an exemplary embodiment, the bump stop 334 may be sized and located relative to the proof mass such that proof mass 302 may contact bump stop 334 in response to rotation of the proof mass that exceeds a rotation threshold in a range of 5-35 degrees (e.g., 15 degrees in an exemplary embodiment). In an embodiment, bump stops 336, 338, 340, and 342 may be located relative to the proof mass in a similar manner to limit translational motion of proof mass 302 in a direction and further to inhibit rotation of the proof mass 302 that exceeds a rotational threshold. Although each bump stop may be designed and located to have a different rotational threshold, in an exemplary embodiment each of the bump stops may have a similar or identical rotation threshold.

In an embodiment, first sensor portion 380 includes an anchor 326 that may be coupled to paddle masses 322 and 330 by connection bars 324 and 328. Paddle masses 322 and 330 may be coupled to proof mass 318 by springs 320 and 332. Connection bars 324 and 328 may be substantially rigid but may facilitate rotational movement of the paddle masses 322 and 330 and the proof mass 318 about rotational axis 366. Springs 320 and 332 may be substantially rigid along the x-axis, may permit limited movement along the y-axis, and may have substantial torsional compliance to allow for the rotation of proof mass 318 about the rotation axis 366. Although in the exemplary embodiment of FIG. 3 the first sensor portion 370 and second sensor portion 380 have a common rotational axis 366, in other embodiments each of the sensor portions 370 and 380 may have a unique rotational axis (e.g., parallel or at an angle). A symmetry axis 364 may be perpendicular to rotational axis 366 and may intersect the rotational axis at a center point of the anchor 326. Proof mass 318 may include a symmetric proof mass portion 382 and an asymmetric proof mass portion 384. Symmetric proof mass portion 382 may be symmetric about the symmetry axis 364. Asymmetric proof mass portion 384 may extend from symmetric proof mass portion 382, such that the proof mass 318 as a whole is asymmetric and has no axis of symmetry. A center of mass 394 for the proof mass 318 may be offset from symmetry axis 364 in the negative x-direction and may be offset from rotational axis 366 in the negative y-direction.

In some embodiments, a plurality of bump stops may extend from the fixed MEMS portion 390 towards proof mass 318. The bump stops may provide surfaces that are contacted under circumstances such as proof mass over travel or shocks. Although it will be understood that additional or fewer bump stops of suitable shapes and sizes may be by implemented in different embodiments in accordance with the present disclosure, in an exemplary embodiment six substantially rectangular bump stops 344, 346, 348, 350, and 352 may be located at locations adjacent to proof mass 318.

In an exemplary embodiment, bump stop 344 may be located adjacent to an upper-right portion of symmetric proof mass portion 382 to inhibit translational movement of proof mass 318 in the positive y-direction. Bump stop 344 may also be located such that rotation of the proof mass 318 about the z-axis (or combined translational and rotational movement) may cause the upper-right portion of symmetric proof mass portion 382 to contact the bump stop 344 at an angle. In an exemplary embodiment, the bump stop 344 may be sized and located relative to the proof mass such that proof mass 318 may contact bump stop 344 in response to rotation of the proof mass that exceeds a rotation threshold in a range of 5-35 degrees (e.g., 15 degrees in an exemplary embodiment). In an embodiment, bump stops 346, 348, 350, and 352 may be located relative to the proof mass in a similar manner to limit translational motion of proof mass 318 in a direction and further to inhibit rotation of the proof mass 318 that exceeds a rotational threshold. Although each bump stop may be designed and located to have a different rotational threshold, in an exemplary embodiment each of the bump stops may have a similar or identical rotation threshold.

A linear acceleration in the positive z-direction may cause the center of mass 392 of proof mass 302 to move in the negative z-direction about the rotational axis 366 and may cause the center of mass 394 of proof mass 318 to move in the negative z-direction about the rotational axis 366. Asymmetric proof mass portion 374 and the portion of the symmetric proof mass portion 372 located to the positive y-direction from the rotational axis 366 may move towards the substrate and any sense electrodes located below these portions of the proof mass 302. Other portions of proof mass 302 may move away from the substrate and any sense electrodes located below these other portions of the proof mass 302. Asymmetric proof mass portion 384 and the portion of the symmetric proof mass portion 382 to the negative y-direction from the rotational axis 366 may move towards the substrate and any sense electrodes located below these portions of the proof mass 318. Other portions of proof mass 318 may move away from the substrate and any sense electrodes located below these other portions of the proof mass 318.

A linear acceleration in the negative z-direction may cause the center of mass 392 of proof mass 302 to move in the positive z-direction about the rotational axis 366 and may cause the center of mass 394 of proof mass 318 to move in the positive z-direction about the rotational axis 366. Asymmetric proof mass portion 374 and the portion of the symmetric proof mass portion 372 located to the positive y-direction from the rotational axis 366 may move away the substrate and any sense electrodes located below these portions of the proof mass 302. Other portions of proof mass 302 may move towards the substrate and any sense electrodes located below these other portions of the proof mass 302. Asymmetric proof mass portion 384 and the portion of the symmetric proof mass portion 382 to the negative y-direction from the rotational axis 366 may move away from the substrate and any sense electrodes located below these portions of the proof mass 318. Other portions of proof mass 318 may move towards the substrate and any sense electrodes located below these other portions of the proof mass 318.

In an exemplary embodiment, paddles masses may be coupled to each of the proof masses to facilitate sensor offset stability. Sense electrodes may be located on a substrate plane below the proof masses to perform differential capacitive sensing based on the rotation of proof masses 302 and 318 about rotational axis 366. Torsion springs coupled between each of the proof masses and an anchor and paddle mass may suspend the paddle mass and proof mass and may permit rotation of the proof mass about the rotational axis. In this manner, the rotation of proof mass 302 about rotational axis 366 increasing or decreasing capacitances associated with portions of the proof masses based on the location of the sense electrodes and the direction of rotation. The rotation of proof mass 318 about rotational axis 366 increasing or decreasing capacitances associated with portions of the proof masses based on the location of the sense electrodes and the direction of rotation.

Figure 4A:
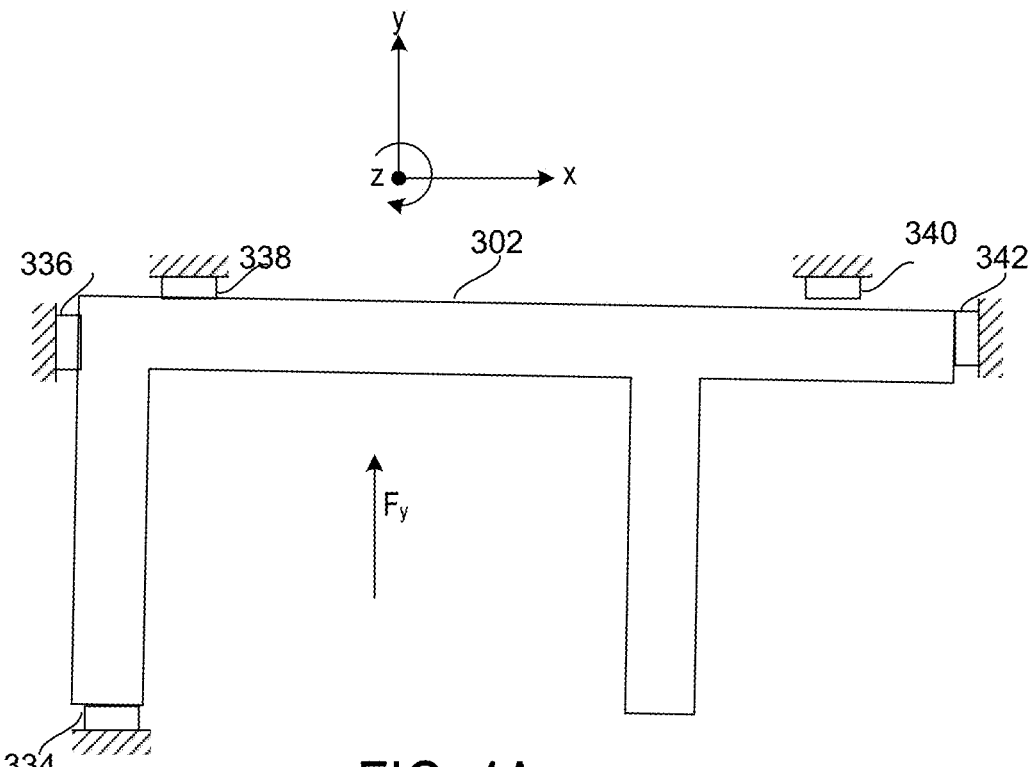
FIG. 4A shows a movement of an asymmetric proof mass of FIG. 3 relative to bump stops in response to a single translational in-plane linear acceleration in accordance with some embodiments of the present disclosure.

FIG. 4A shows a movement of an asymmetric proof mass (e.g., proof mass 302) of FIG. 3 relative to bump stops in response to a single in-plane linear acceleration in accordance with some embodiments of the present disclosure. FIG. 4A omits other components (e.g., paddle masses, torsion springs, anchor, second sensor portion, etc.) for ease of illustration. It will be understood that in some embodiments the bump stops depicted in FIG. 4A may have different shapes, may be located at different locations relative to the proof mass 302, and may be located at different distances relative to proof mass 302. It will be understood that one or more additional bump stops may be added and one or more of the depicted bump stops may be removed in some embodiments.

FIG. 4A shows the motion of the proof mass 302 during an undesired linear acceleration due to a shock in the positive y-direction. In the exemplary embodiment of FIG. 4A, the shock is idealized such that no force is experienced in the x-direction. As a result of the linear acceleration solely in the positive y-direction, the proof mass 302 translates in the positive y-direction and rotates about the z axis to contact the bump stops 340. The upper x-z plane face of the proof mass 302 contacts at an angle the lower x-z plane faces of the bump stops 340.

Figure 4B:
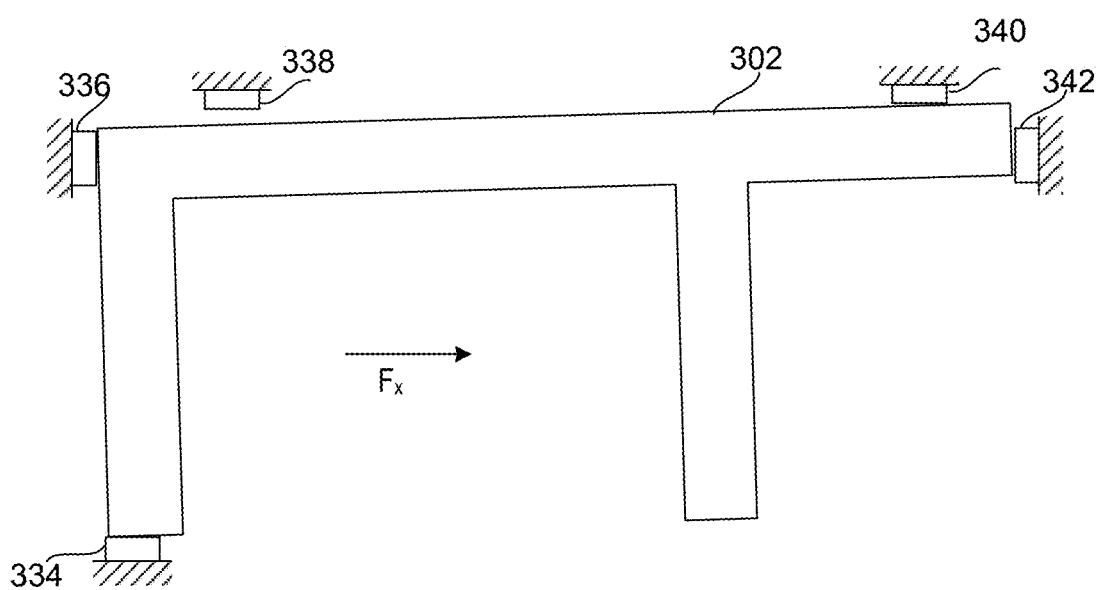
FIG. 4B shows a movement of an asymmetric proof mass of FIG. 3 relative to bump stops in response to a multi-direction in-plane linear acceleration in accordance with some embodiments of the present disclosure.

FIG. 4B shows the motion of the proof mass 302 during an undesired linear acceleration due to a shock in the positive x-direction. The asymmetric shape of the proof mass causes rotational movement of the proof mass 302 in response to the linear accelerations in the x-direction. Even when the force in one of the x-direction or y-direction is significantly greater (e.g., an order of magnitude) than the other force, the asymmetric shape of the proof mass may cause rotational coupling of the forces and rotation of proof mass 302 about anchor 310.

In an embodiment, the counter-clockwise rotation about the anchor 310 may cause the proof mass 302 to contact each of bump stops 334, 336, 340, and 342. The bottom-left x-z face of proof mass 302 may contact bump stop 334, the upper-left y-z face may contact bump stop 336, the upper-right x-z face of proof mass 302 may contact bump stop 340, and the upper right y-z face of proof mass 302 may contact bump stop 342. Thus, in the exemplary embodiment of FIG. 4B, four faces of proof mass 302 contact four bump stops, rather than a single face contacting two bump stops. This improves the distribution of the force of the shock from the proof mass 302 to the additional bump stops. The asymmetric proof mass 302 shape supports this distribution of force by causing rotation of the proof mass in most instances of shock.

An angled shock that passes through both the center of rotation of the springs and the center of mass of the proof mass will cause the proof mass to translate without rotating. This angled shock will be in a direction that is different to the minimum stiffness direction of the springs. Therefore, the restoring force of the springs during proof mass to bump stop contact is increased, increasing the devices ability to reject stiction.

Figure 5:
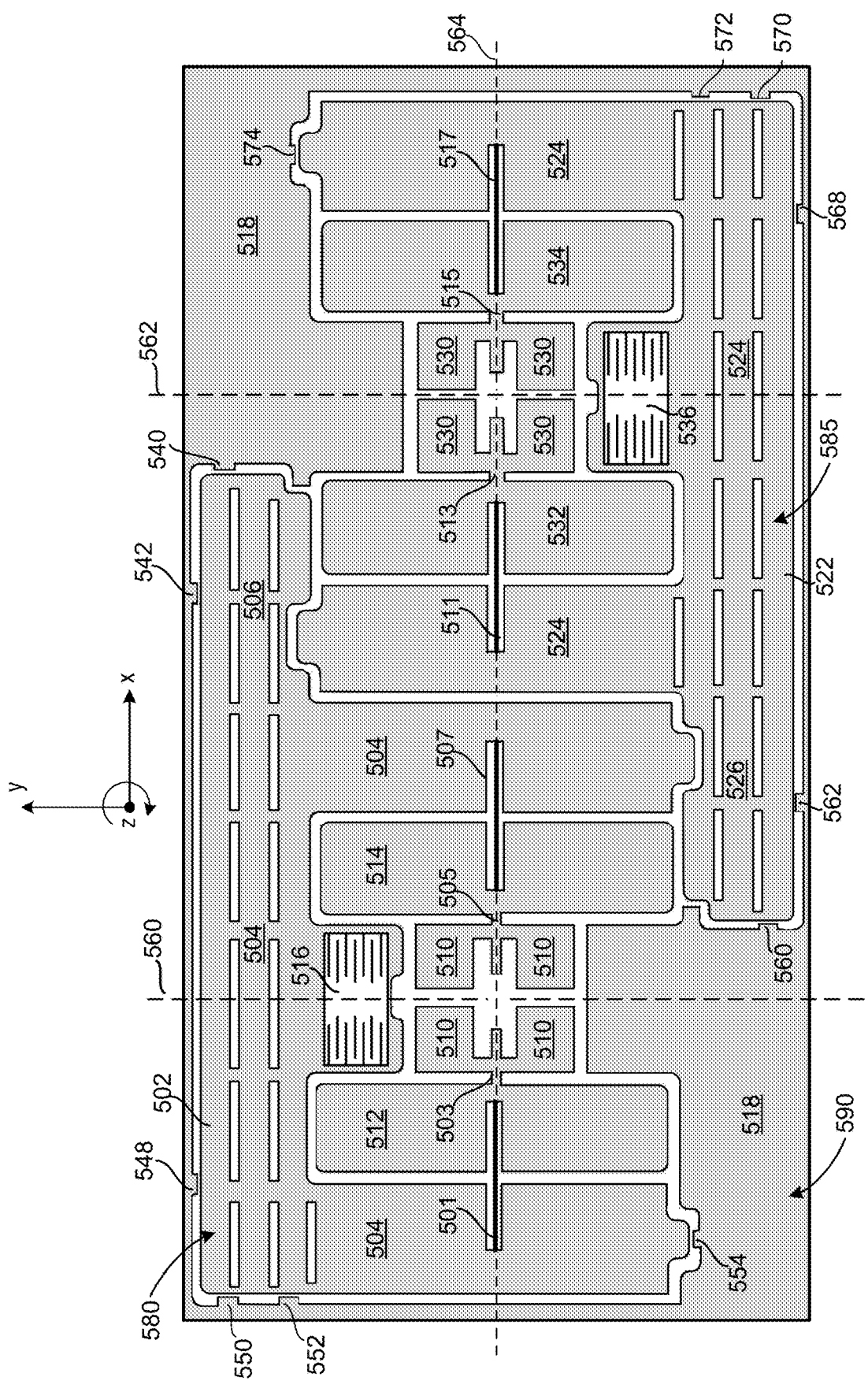
FIG. 5 shows an illustrative MEMS device plane of an out-of-plane sensing accelerometer in accordance with some embodiments of the present disclosure.

FIG. 5 shows an illustrative MEMS device plane of an out-of-plane sensing accelerometer in accordance with some embodiments of the present disclosure. It will be understood by a person having ordinary skill in the art that FIG. 5 may be modified in a variety of manners in accordance with the present disclosure. In an exemplary embodiment the out-of-plane sensing accelerometer includes a first sensor portion 580, a second sensor portion 585, and a fixed MEMS portion 590.

In some embodiments, first sensor portion 580 may include an anchor region 510. The exemplary anchor region 510 may include a plurality of anchor portions, each of which is anchored to each of a cap layer and a substrate layer and is fixed within the MEMS device layer. A symmetry axis 560 and rotational axis 564 may intersect at the center point of anchor region 510, with the symmetry axis 560 extending along the y-axis and the rotational axis 564 extending along the x-axis perpendicular to the symmetry axis 560.

In some embodiments, a paddle mass 512 may be coupled to a left-side portion of the anchoring region by torsion bar 503 and a paddle mass 514 may be coupled to a right-side portion of the anchoring region by torsion bar 505. Torsion bars 503 and 505 may have an appropriate aspect ratio to support the movable components of the first sensor portion 580 (e.g., paddle mass 512, paddle mass 514, and proof mass 502) while springs 501 and 507 couple the proof mass 502 in a manner that permits out-of-plane rotation of the proof mass 502 about the rotational axis 564 in response to an out-of-plane movement of sensor portion 580.

Paddle masses 512 and 514 may be coupled to an asymmetric proof mass portion 504 of proof mass 502 by respective springs 501 and 507. Each of springs 501 and 507 may be substantially rigid along the x-axis, may permit limited movement along the y-axis, and may have substantial torsional compliance to permit rotational motion between of the proof mass 502 relative to paddle masses 512 and 514. Collectively, springs 501 and 507 may be aligned with torsion bars 503 and 505 along the x-axis to form a rotational axis 564 for first sensor portion 580. One or more sense electrodes (not depicted) may be located on a substrate below the proof mass 502 to form one or more sense capacitors. In an exemplary embodiment, paddle electrodes may be associated with each of paddle masses 512 and 514, such that offset compensation (e.g., due to temperature effects, shear forces, manufacturing, or packaging) may be performed based on the relative out-of-plane locations of the paddle masses 512 and 514.

Proof mass 502 may include a symmetric proof mass portion 504 and an asymmetric proof mass portion 506 extending from the symmetric portion 504 in a direction parallel to the rotational axis. Symmetric proof mass portion 504 may be symmetric about symmetry axis 560. Because of asymmetric proof mass portion 506 extending from symmetric proof mass portion 506, forces such as shocks may result in a rotational motion of the proof mass 502 about the anchoring region 510 rather than translational motion, and may increase a degree of rotational motion as a result of a shock as compared to a symmetric proof mass.

In some embodiments, fixed MEMS potion 590 may include a plurality of bump stops that are located adjacent to proof mass 502. Although suitable bump stops may be located at different locations of fixed MEMS portion 590, bump stops may have different shapes, and bump stops may be added or removed in some embodiments, in an exemplary embodiment each of the bump stops that is located adjacent to proof mass 502 may have a generally rectangular shape and may be locate to limit translational motion in a particular direction and to inhibit rotation that exceeds a rotational threshold in a range of 5-35 degrees (e.g., 15 degrees in an exemplary embodiment). In an embodiment, bump stop 554 may be located at a lower left side of symmetric proof mass portion 504 to limit rotation and negative y-axis movement, bump stops 550 and 552 may be located at an upper left side of symmetric proof mass portion 504 to limit rotation and negative x-axis movement, bump stop 548 may be located at the upper left side of symmetric proof mass portion 504 to limit rotation and positive y-axis movement, bump stop 542 may be located an upper right side of asymmetric proof mass portion 506 to limit rotation and positive y-axis movement, and bump stop 540 may be located an upper right side of asymmetric proof mass portion 506 to limit rotation and positive x-axis movement.

In some embodiments, second sensor portion 585 may include an anchor region 530. The exemplary anchor region 530 may include a plurality of anchor portions, each of which is anchored to each of a cap layer and a substrate layer and is fixed within the MEMS device layer. A symmetry axis 562 and rotational axis 564 may intersect at the center point of anchor region 530, with the symmetry axis 562 extending along the y-axis and the rotational axis 564 extending along the x-axis perpendicular to the symmetry axis 560. In the exemplary embodiment of FIG. 5, the second sensor portion 585 may have the same rotational axis as first sensor portion 580, although in other embodiments the rotational axes may be parallel or at an angle to each other.

In some embodiments, a paddle mass 532 may be coupled to a left-side portion of the anchoring region 530 by torsion bar 513 and a paddle mass 534 may be coupled to a right-side portion of the anchoring region 530 by torsion bar 515. Torsion bars 513 and 515 may have an appropriate aspect ratio to support the movable components of the second sensor portion 580 (e.g., paddle mass 532, paddle mass 534, and proof mass 522) while permitting out-of-plane rotation of the proof mass 522 about the rotational axis 564 in response to an out-of-plane movement of proof mass 522.

Paddle masses 532 and 534 may be coupled to an asymmetric proof mass portion 524 of proof mass 522 by respective springs 511 and 517. Each of springs 511 and 517 may be substantially rigid along the x-axis, may permit limited movement along the y-axis, and may have substantial torsional compliance to enable rotational motion of the proof mass 522 and about the rotational axis 564. Collectively, springs 511 and 517 may be aligned with torsion bars 513 and 515 along the x-axis to form a rotational axis 564 for second sensor portion 585. One or more sense electrodes (not depicted) may be located on a substrate below the proof mass 522 to form one or more sense capacitors. In an exemplary embodiment, additional paddle electrodes may be associated with each of paddle masses 532 and 534, such that offset compensation (e.g., due to temperature effects, shear forces, manufacturing, or packaging) may be performed based on the relative out-of-plane locations of the paddle masses 532 and 534.

Proof mass 522 may include a symmetric proof mass portion 524 and an asymmetric proof mass portion 526 extending from the symmetric portion 524 in a direction parallel to the rotational axis. Symmetric proof mass portion 524 may be symmetric about symmetry axis 562. Because of asymmetric proof mass portion 526 extending from symmetric proof mass portion 526, forces such as shocks may result in a rotational motion of the proof mass 522 about the anchoring region 530 rather than translational motion, and may increase a degree of rotational motion as a result of a shock as compared to a symmetric proof mass.

In some embodiments, fixed MEMS potion 590 may include a plurality of bump stops that are located adjacent to proof mass 522. Although suitable bump stops may be located at different locations of fixed MEMS portion 590, may have different shapes, and bump stops may be added or removed in some embodiments, in an exemplary embodiment each of the bump stops that is located adjacent to proof mass 522 may have a generally rectangular shape and may be locate to limit translational motion in a particular direction and to inhibit rotation that exceeds a rotational threshold in a range of 5-35 degrees (e.g., 15 degrees in an exemplary embodiment). In an embodiment, bump stop 574 may be located at an upper right side of symmetric proof mass portion 524 to limit rotation and positive y-axis movement, bump stops 570 and 572 may be located at a bottom right side of symmetric proof mass portion 524 to limit rotation and positive x-axis movement, bump stop 568 may be located a lower right side of symmetric proof mass portion 524 to limit rotation and negative y-axis movement, bump stop 562 may be located a lower left side of asymmetric proof mass portion 526 to limit rotation and negative y-axis movement, and bump stop 560 may be located a lower left side of asymmetric proof mass portion 526 to limit rotation and negative x-axis movement.

A linear acceleration in the positive z-direction may cause proof mass 502 to rotate about rotational axis 564 in a counterclockwise direction, such that a positive y-axis portion of proof mass 502 (e.g., including the larger portion of symmetric proof mass 504 and all of asymmetric proof mass portion 506) rotates out-of-plane in the negative z-direction while the negative x-axis portion of proof mass 502 (e.g., the small portion of symmetric proof mass portion 504) rotates out of plane in the positive z-direction. Sense electrodes may be located below portions of the proof mass 502 to sense changes in capacitance due to the this movement. The linear acceleration in the positive z-direction may cause proof mass 522 to rotate about rotational axis 564 in a clockwise direction, such that a negative y-axis portion of proof mass 522 (e.g., including the larger portion of symmetric proof mass 524 and all of asymmetric proof mass portion 526) rotates out-of-plane in the negative z-direction while the positive y-axis portion of proof mass 522 (e.g., the small portion of symmetric proof mass portion 524) rotates out of plane in the positive x-direction. Sense electrodes may be located below portions of the proof mass 522 to sense changes in capacitance due to the this movement.

A linear acceleration in the negative z-direction may cause proof mass 502 to rotate about rotational axis 564 in a clockwise direction, such that a positive y-axis portion of proof mass 502 (e.g., including the larger portion of symmetric proof mass 504 and all of asymmetric proof mass portion 506) rotates out-of-plane in the positive z-direction while the negative x-axis portion of proof mass 502 (e.g., the small portion of symmetric proof mass portion 504) rotates out of plane in the negative z-direction. Sense electrodes may be located below portions of the proof mass 502 to sense changes in capacitance due to the this movement. The linear acceleration in the negative z-direction may cause proof mass 522 to rotate about rotational axis 564 in a clockwise direction, such that a negative y-axis portion of proof mass 522 (e.g., including the larger portion of symmetric proof mass 524 and all of asymmetric proof mass portion 526) rotates out-of-plane in the positive z-direction while the positive y-axis portion of proof mass 522 (e.g., the small portion of symmetric proof mass portion 524) rotates out of plane in the negative z-direction. Sense electrodes may be located below portions of the proof mass 522 to sense changes in capacitance due to the this movement.

As is depicted in FIG. 5, the movable MEMS components of first sensor portion 580 and second sensor portion 585 may be located in close proximity to other movable components and to the fixed MEMS portion 590 within the MEMS device plane. The asymmetric proof mass portions 506 and 526 may create a lever effect with respect to an applied shock or vibration force, which may reduce stiction in the proof mass and other MEMS components.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical (MEMS) accelerometer, comprising:
    one or more anchors;
    a proof mass within a MEMS device layer comprising a plurality of contiguous portions that rotate collectively about a rotational axis in response to a linear acceleration along a sense axis, wherein the plurality of contiguous portions of the proof mass comprise:
        a symmetric portion that is symmetric about a symmetry axis wherein the symmetry axis is perpendicular to the rotational axis; and
        an asymmetric portion that is asymmetric about the symmetry axis; and
    one or more springs within the MEMS device layer and coupling the proof mass to the one or more anchors, wherein the one or more springs couple the proof mass to the one or more anchors such that the proof mass rotates about the rotational axis in response to the linear acceleration along the sense axis, and wherein the asymmetric portion does not extend through either the rotational axis or the symmetry axis.

2. The MEMS accelerometer of claim 1, wherein the rotation about the rotational axis causes the proof mass to move out of plane.

3. The MEMS accelerometer of claim 2, wherein the symmetric portion simultaneously rotates both above and below the MEMS device plane in response to the rotation and wherein the asymmetric portion only moves above or below the MEMS device plane at any one time.

4. The MEMS accelerometer of claim 2, wherein the proof mass experiences a rotational motion in the MEMS device plane in response to a force that is in the MEMS device plane.

5. The MEMS accelerometer of claim 4, further comprising a plurality of bump stops, wherein at least one of the plurality of bump stops is located adjacent to the asymmetric portion to prevent the rotational motion in the MEMS device plane.

6. The MEMS accelerometer of claim 5, wherein the at least one of the plurality of bump stops contacts the asymmetric portion at least a 15 degree angle in response to the rotational motion in the MEMS device plane.

7. The MEMS accelerometer of claim 1, wherein the asymmetric portion has a mass that is at least 20% of the mass of the symmetric portion.

8. The MEMS accelerometer of claim 1, wherein the symmetric portion includes a plurality of extensions that are adjacent to at least three sides of the one more anchors.

9. The MEMS accelerometer of claim 8, wherein the asymmetric portion is not adjacent to any sides of the one or more anchors.

10. The MEMS accelerometer of claim 9, wherein the plurality of extensions is substantially rectangular in shape.

11. The MEMS accelerometer of claim 9, wherein the asymmetric portion is substantially rectangular in shape.

12. The MEMS accelerometer of claim 1, further comprising:
    one or more second anchors;
    a second proof mass within the MEMS device layer comprising a plurality of second contiguous portions that rotate collectively about a second rotational axis in response to the linear acceleration along the sense axis, wherein the plurality of second contiguous portions of the second proof mass comprise:
        a second symmetric portion that is symmetric about a second symmetry axis wherein the second symmetry axis is perpendicular to the second rotational axis; and
        a second asymmetric portion that is asymmetric about the second symmetry axis; and
    one or more second springs within the MEMS device layer and coupling the second proof mass to the one or more second anchors, wherein the one or more second springs couple the second proof mass to the one or more second anchors such that the second proof masses rotate about the second rotational axis in response to the linear acceleration along the sense axis.

13. The MEMS accelerometer of claim 12, wherein the second proof mass and the proof mass have a substantially identical shape.

14. The MEMS accelerometer of claim 12, wherein the rotation of the second proof mass in response to the linear acceleration and the rotation of the proof mass in response to the linear acceleration are in anti-phase.

15. The MEMS accelerometer of claim 14, wherein at least part of the first asymmetric portion is located adjacent to at least a part of the second symmetric portion, and wherein at least part of the second asymmetric portion is located adjacent to at least part of the first symmetric portion.

16. The MEMS accelerometer of claim 12, wherein the first rotational axis and the second rotational axis comprise the same axis.

17. The MEMS accelerometer of claim 12, wherein the first rotational axis and the second rotational axis are parallel to each other.

* * * * *